(12) United States Patent
Cho

(10) Patent No.: US 7,611,978 B2
(45) Date of Patent: Nov. 3, 2009

(54) METHOD FOR FORMING GATE ELECTRODE OF SEMICONDUCTOR DEVICE

(75) Inventor: Eun Sang Cho, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/124,058

(22) Filed: May 20, 2008

(65) Prior Publication Data

US 2008/0293227 A1      Nov. 27, 2008

(30) Foreign Application Priority Data

May 21, 2007   (KR) ..................... 10-2007-0049031

(51) Int. Cl.
*H01L 21/3205* (2006.01)
(52) U.S. Cl. .................. 438/585; 438/532; 438/705; 257/E21.177
(58) Field of Classification Search .......... 438/585, 438/669, 705, 532, 639; 257/E21.158, E21.177
See application file for complete search history.

(56) References Cited

U.S. PATENT DOCUMENTS

| | | | | |
|---|---|---|---|---|
| 4,438,556 A | * | 3/1984 | Komatsu et al. ............ | 438/532 |
| 4,601,778 A | * | 7/1986 | Robb ......................... | 438/513 |
| 5,236,547 A | * | 8/1993 | Takahashi et al. ........... | 438/498 |
| 5,817,558 A | * | 10/1998 | Wu ............................ | 438/291 |
| 6,599,840 B2 | * | 7/2003 | Wu et al. .................... | 438/705 |
| 7,192,837 B2 | * | 3/2007 | Koh ........................... | 438/299 |

FOREIGN PATENT DOCUMENTS

KR      1997-0030497      6/1997

* cited by examiner

*Primary Examiner*—Tuan N. Quach
(74) *Attorney, Agent, or Firm*—Workman Nydegger

(57) ABSTRACT

Provided is a method for forming a gate electrode of a semiconductor device which can form a gate electrode having a fine line width. Disclosed method steps include forming a gate oxide film, a polysilicon film for a gate electrode, and a first sacrificial layer on the entire surface of a semiconductor substrate and then forming an opening within the first sacrificial layer. The effective width of the hole is reduced, and an ion implantation layer is formed on the top surface of the polysilicon film in the region exposed through the hole. A gate electrode is formed under the ion implantation layer by using the ion implantation layer as a mask.

15 Claims, 5 Drawing Sheets

METHOD FOR FORMING GATE ELECTRODE OF SEMICONDUCTOR DEVICE

CROSS-REFERENCE TO RELATED APPLICATION

This application claims priority to Korean Application No. 10-2007-0049031, filed on May 21, 2007, which is incorporated herein by reference in its entirety.

BACKGROUND OF THE INVENTION

1. The Field of the Invention

Embodiments of the present invention relate generally to methods for forming a gate electrode of a semiconductor device.

2. The Relevant Technology

A MOS (Metal-Oxide Semiconductor) transistor is one example of a semiconductor device. The MOS transistor includes a source region and a drain region, which are spaced from each other by a predetermined distance. A channel region is defined in a predetermined portion of the semiconductor substrate substantially between the source and drain region, and a gate electrode is stacked on top of the channel region. Typically, a gate dielectric film, such as a gate oxide film is disposed between the gate electrode and the channel region. Usually the source region and drain region, the gate oxide film, and the gate electrode are all covered with an interlayer dielectric film.

In this type of configuration, the channel region, the gate oxide film, and the gate electrode constitute one capacitor, and an inversion layer or an accumulation layer is formed in the channel region according to a voltage applied to the gate electrode. Accordingly, the gate electrode functions to control current flowing between the source drain and the drain region.

Optimally, the gate electrode has good conductivity, has a high melting point, and is easy to pattern. To achieve these conditions, the gate electrode is typically formed of a polysilicon film, which is easily doped with impurities at a high concentration and can be kept in a stable shape in a subsequent thermal process that is conducted at a high temperature.

FIGS. 1a to 1d are cross sectional views sequentially illustrating a conventional process for forming a gate electrode.

In this process, a gate electrode 30' is formed by a combination of a typical photo-lithography process and a subsequent etching process.

For example, as is shown in FIG. 1, a gate oxide film 20 is formed on the entire surface of a semiconductor substrate 10 by a method, such as deposition, and then a polysilicon film 30 for a gate electrode 30 is formed to be stacked on the entire surface of the corresponding gate oxide film 20 by a method, such as deposition.

For the deposition of the gate oxide film 20 and the polysilicon film 30, an LPCVD (Low Pressure Chemical Vapor Deposition) can be used.

Afterwards, as shown in FIG. 1b, a photoresist pattern 40 is formed on top of the corresponding polysilicon film 30 by a typical photo-lithography process so as to enclose and define only the region in which a gate electrode 30' (FIG. 1c) is to be formed. The photo-lithography process includes a series of steps, such as photoresist solution coating, exposure, and development steps.

Next, as shown in FIG. 1c, portions of the polysilicon film 30 and gate oxide film 20 except for the region where the photoresist pattern 40 is formed are selectively removed by etching by using the formed photoresist pattern 40 as an etching mask. A gate electrode 30' is formed by way of the remaining polysilicon film 30 material.

The etching may be a dry etching having an anisotropic characteristic, such as RIE (Reactive Ion Etching).

As is shown in FIG. 1d, the photoresist pattern 40 is then removed by, for example, a plasma ashing process.

When necessary, a BARC (Bottom of Anti-Reflection Coating) film can be formed under the photoresist pattern 40 so as to prevent the reflection of an exposure light upon exposure during the photo-lithography process. In this case, the BARC film is removed first upon etching, and then the polysilicon film 30 and the gate oxide film 20 are removed under other process conditions.

The gate electrode 30' exerts a large effect on the characteristics of the semiconductor device. In particular, the line width of the gate electrode 30' can become ultra fine.

In order to form a fine gate electrode 30', first, the photoresist pattern 40 should be formed to be fine. To do so, there have been attempts to implement the photoresist pattern 40 having a fine line width by using short-wavelength light sources, such as a KrF having a 248 nm wavelength or an ArF having a 193 nm wavelength as a light source upon exposure and using a photoresist film of the type capable of optically reacting to these light sources. However, this approach is not without drawbacks. In particular, an exposure apparatus having a short-wavelength light source is expensive, which results in higher overall manufacturing costs.

In one conventional approach, the line width is made smaller by etching the edges of the photoresist pattern 40 formed by the photo-lithography process by additionally performing a photoresist trimming process. However, this solution is not entirely satisfactory either since the vertical thickness of the photoresist pattern 40 is reduced by trimming etching, the corresponding photoresist pattern 40 cannot resist the subsequent polysilicon film 30 in a main etching stage, which can cause an etching deficiency.

SUMMARY OF THE INVENTION

In general, example embodiments of the present invention relate to methods for forming a gate electrode of a semiconductor device, and which can be used to form a gate electrode having an ultra fine line width.

In an example embodiment, a gate electrode is provided by forming a fine hard mask by way of a photo-lithography process. A main etching by using the corresponding hard mask is performed to form the gate electrode.

In accordance with one example embodiment, a method for forming a gate electrode includes first sequentially stacking a gate film, a film for forming a gate electrode, and a first sacrificial layer on the surface of a suitable semiconductor substrate. An opening is then formed within the first sacrificial layer by, for example, using a photoresist pattern. The photoresist pattern is then removed, and the effective width of the opening is reduced—which ultimately results in a gate electrode having a minimized line width.

While different techniques might be used, in one embodiment, the effective width of the opening is reduced by forming a spacer on a sidewall within the opening. In one embodiment, the spacer is provided by forming a second sacrificial layer on the first sacrificial layer. The second sacrificial layer formed at the bottom of the opening is removed, and an ion implantation layer is formed on the top surface of the polysilicon film in the region exposed through the opening such that the width is narrowed by the spacer. The sacrificial layers are removed, and a gate electrode is formed under the ion implantation layer by performing a main etching by using the ion implantation layer as a hard mask. The ion implantation layer is then removed.

At least one advantage and feature of this example process is that the resulting gate electrode has a very fine line width. Moreover, the fine line width is provided without the need for expensive and specialized equipment, and the process otherwise avoids the etching deficiencies of the prior art.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1A:
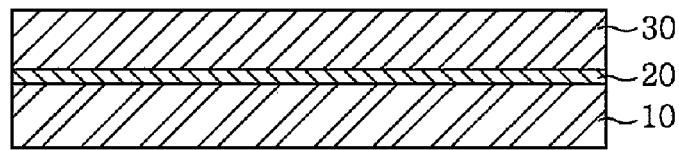
FIGS. 1a to 1d are process cross sectional views sequentially showing a conventional method for forming a gate electrode.
Figure 1B:
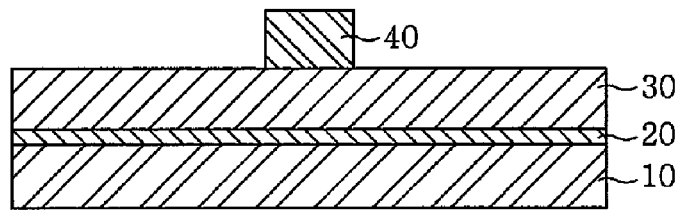
Figure 1C:
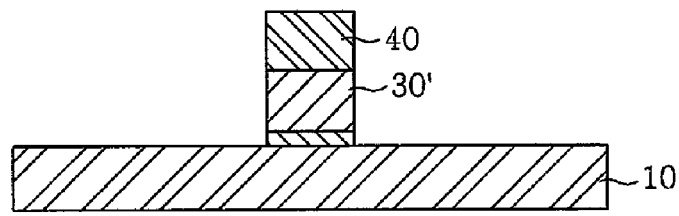
Figure 1D:
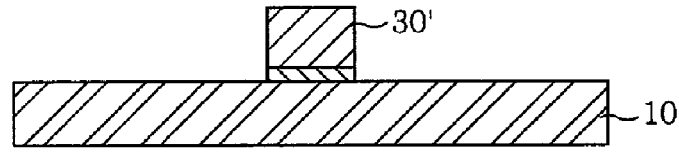

Hereinafter, a method for fabricating a gate electrode in accordance with one or more example embodiments of present invention will be described in detail with reference to the accompanying drawings. In the following detailed description of the example embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

In general, one example of a disclosed process includes forming a first sacrificial layer on a polysilicon film, and an opening is formed on the first sacrificial layer by a photo-lithography process and an etching process. In a preferred embodiment, the effective width of the opening is narrowed, or otherwise reduced, which, as will be seen, assists in providing a gate electrode having fine line width. In one disclosed embodiment, the width of the opening is reduced by forming a spacer on a side wall of the opening of the first sacrificial layer. In illustrated embodiments, the spacer is formed by depositing a second sacrificial layer on the first sacrificial layer. An ion implantation layer, which is to be subsequently used as a hard mask, is then formed by an ion implantation on the upper surface of the polysilicon film exposed by the opening and narrowed by the spacer, and a main etching is performed by use of the corresponding ion implantation layer, thereby forming a target gate electrode having an ultra fine line width.

FIGS. 2a to 2i are process cross sectional views sequentially showing one example of a method for forming a gate electrode of a semiconductor device in accordance with the teachings of the present invention.

Figure 2A:
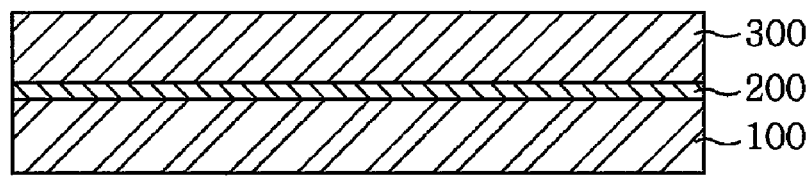
FIGS. 2a to 2k are process cross sectional views sequentially showing a method for forming a gate electrode of a semiconductor device according to a preferred embodiment of the present invention.

Referring first to FIG. 2a, a gate oxide film 200 and a polysilicon film 300 for a gate electrode are formed on the surface of a semiconductor substrate 100 by any suitable method, such as deposition.

Figure 2B:
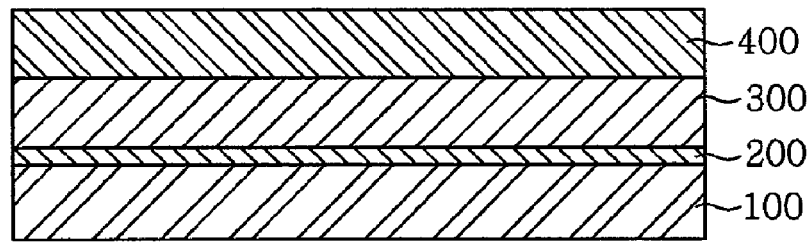

As is next shown in FIG. 2b, a first sacrificial layer 400 is formed on the surface of the polysilicon film 300 by a suitable method, such as deposition. While any one of a number of different deposition methods might be used for placement of the gate oxide and polysilicon films, and the sacrificial layer, in an illustrated embodiment an LPCVD method can be used.

By way of example and not limitation, the first sacrificial layer 400 can be formed of a nitride film. One suitable example is silicon nitride (SiN).

Figure 2C:
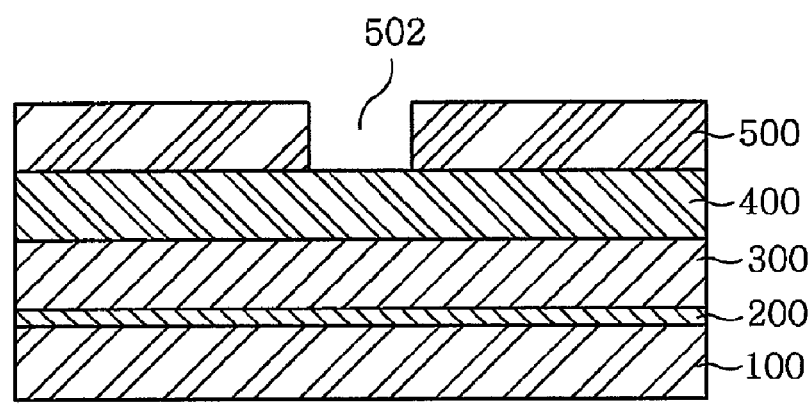

Reference is next made to FIG. 2c, in which a photoresist pattern 500 is formed on top surface of the first sacrificial layer 400. In the illustrated embodiment, the photoresist pattern is deposited by way of a suitable photo-lithography process, and in a manner so as to provide a through hole 502 for opening the region where a gate electrode 300' is to be formed. The photo-lithography process includes a series of steps, such as photoresist solution coating, exposure, and development steps. If needed, a BARC (Bottom of Anti-Reflection Coating) film can be formed under the photoresist pattern 500 so as to prevent the reflection of an exposure light upon exposure.

Figure 2D:
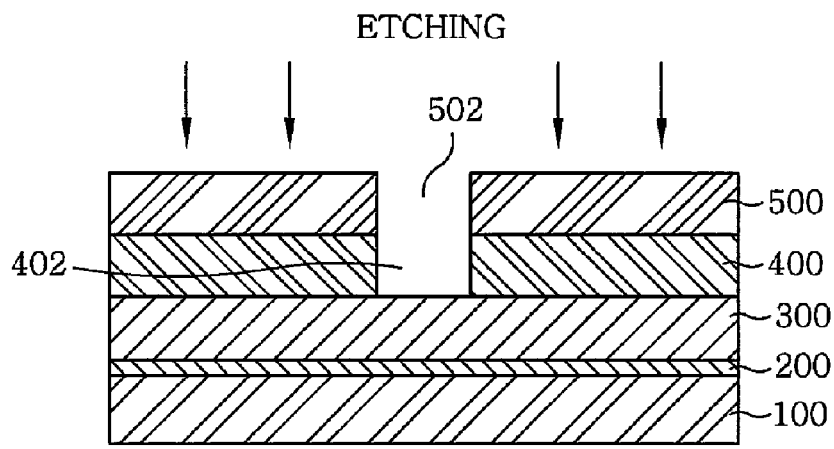

Referring next to FIG. 2d, the first sacrificial layer 400 exposed by the through hole 502 is etched by using the formed photoresist pattern 500 as an etching barrier, thereby forming a vertical opening 402 within the first sacrificial layer 400.

While other etching techniques might be used, in the illustrated embodiment the etching may be a dry etching having an anisotropic characteristic and performed so as to enable removal in a vertical direction. One example is RIE (Reactive Ion Etching). Any suitable main etching gas can be utilized, including without limitation those from a C—H—F family, such as $SF_6$, or $Cl_2$, $BCl_3$, gas and the like, and $O_2$, $N_2$, Ar, He, and the like can be used as an additive gas.

If a non-reflective film is formed between the photoresist pattern and the first sacrificial layer 400, an RIE method for dry etching (or equivalent) is used in order to remove the non-reflective film and the first sacrificial film 400. Again, suitable etching gases could be selected, such as those from a C—H—F family, added with $O_2$, or $Cl_2$, $BCl_3$, etc. as a main etching gas, and $O_2$, $N_2$, Ar, He, etc. as an additive gas.

Figure 2E:
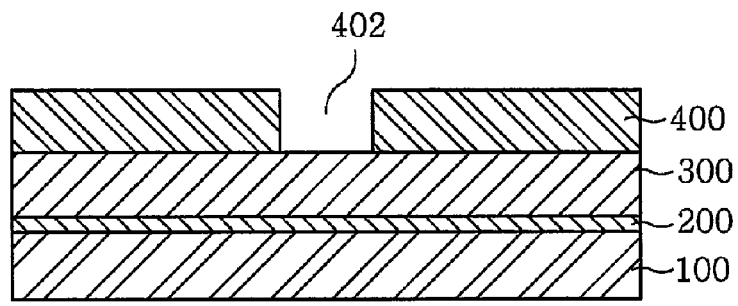

Next, as shown in FIG. 2e, the photoresist pattern 500 used is removed. In an illustrated embodiment, plasma ashing can be used.

Figure 2F:
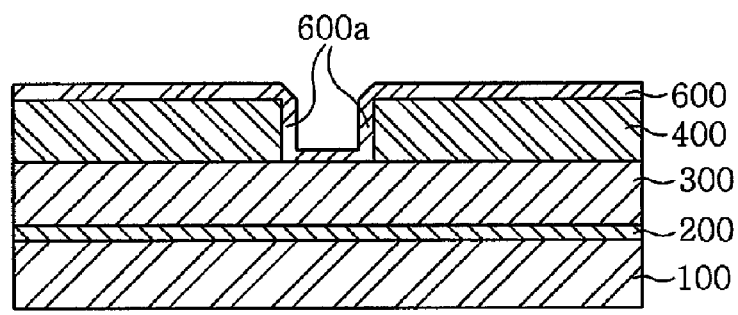

As is shown in FIG. 2f, a second sacrificial layer 600 is deposited on the first sacrificial layer 400 having the opening 402. Accordingly the second sacrificial layer 600 is stacked on top of the first sacrificial layer 400 and the second sacrificial layer 600 is stacked on the sidewall and bottom within the opening 402. In this way, the second sacrificial layer 600 present on the sidewall within the opening 402 forms a spacer 600a for effectively reducing the width of the corresponding opening 402.

While other deposition techniques might be used, deposition of the second sacrificial layer 600 can be performed by way of an LPCVD method. In the illustrated embodiment, the second sacrificial layer 600 is formed of the same material as the first sacrificial layer 400 so that it has an excellent adhesion force to the first sacrificial layer 400. For example, in one embodiment the first sacrificial layer 400 and the second sacrificial layer 600 are formed of SiN. Of course, other materials could also be used, and selected so as to provide a suitable adhesion force.

In the illustrated embodiment, the spacer portion 600a is provided with a desired width by adjusting the degree of deposition of the second sacrificial layer 600.

Figure 2G:
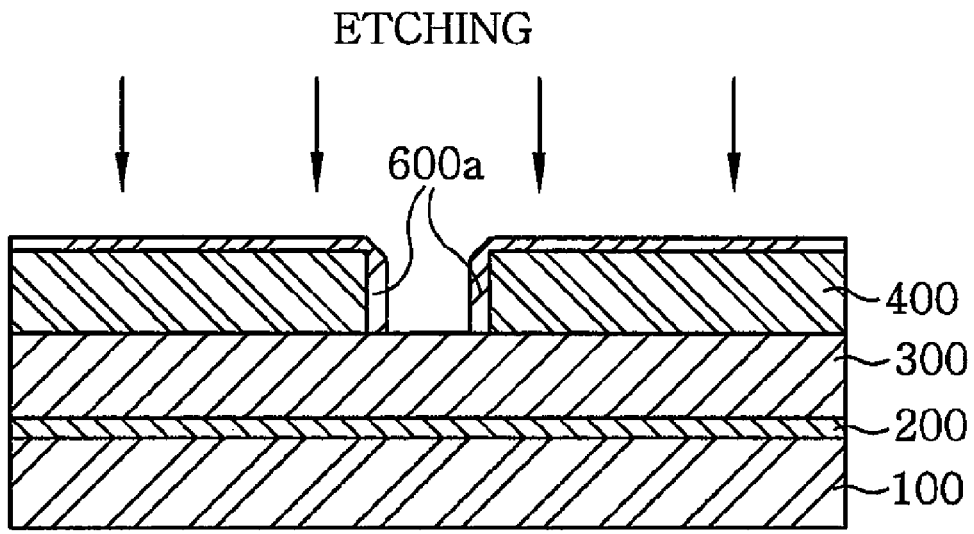

Referring next to FIG. 2g, the portion of the second sacrificial layer 600 that is formed at the bottom of the opening 402 is removed, such as by etching. An etching process results in the removal of a part of the second sacrificial layer 600 in a vertical direction, thereby completely removing the second sacrificial layer 600 present at the bottom of the opening 402, as is denoted in FIG. 2g.

While other techniques might be used, in an illustrated embodiment the etching is a dry etching having an anisotropic characteristic, such as RIE (Reactive Ion Etching). As etching gases for the process, those similar or identical to the ones used in the step of FIG. 2d can be used.

Figure 2H:
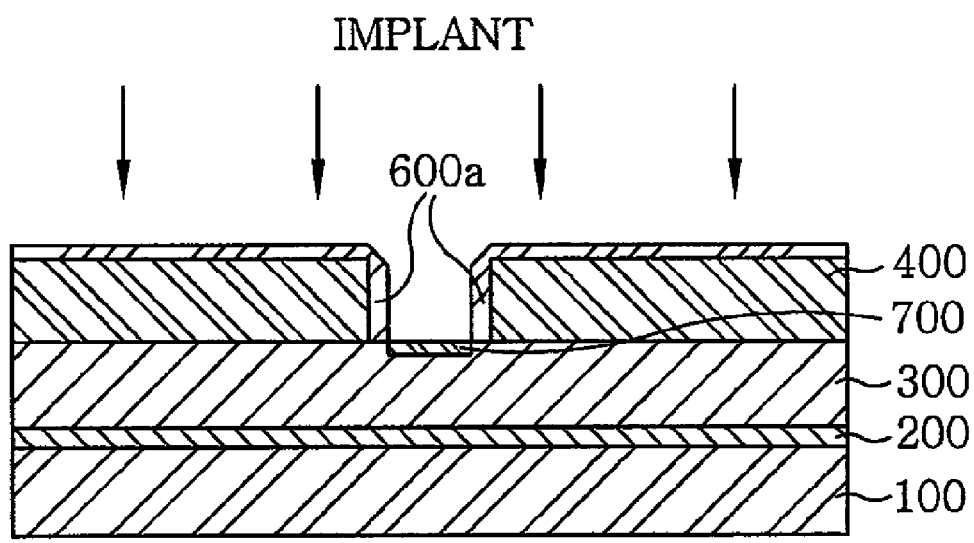

Next, as is shown in FIG. 2h, an ion implantation of specific atoms is performed. In this way, an ion implantation layer 700 is formed into the top surface of the polysilicon film 300 in the region exposed through the opening 402, and whose width is narrowed by the spacer 600a.

In preferred embodiments, the specific atoms to be ion-implanted can be selected from those that are widely used in the field of manufacture of semiconductor devices. For example, in illustrated embodiments oxygen ($O^2$) or nitrogen (N) can be used.

In one example, in case of ion implantation of oxygen atoms, if the remaining second sacrificial layer 600 is a nitride film, the ion implantation layer (not shown) formed on the top surface thereof may be an SiON material, and the ion implantation layer 700 formed on the top surface of the polysilicon layer 300 may be an $SiO_2$ material.

The ion implantation of oxygen atoms can be performed under the process condition of an ion implantation energy of 1 to 50 keV and an ion implantation amount (i.e., dose) of E11 to E18 atoms/$cm^2$.

In one embodiment, an annealing thermal treatment can be performed for lattice recovery in the ion implantation layer 700, preferably, under a temperature of 400° C. for 30 minutes or more.

Figure 2I:
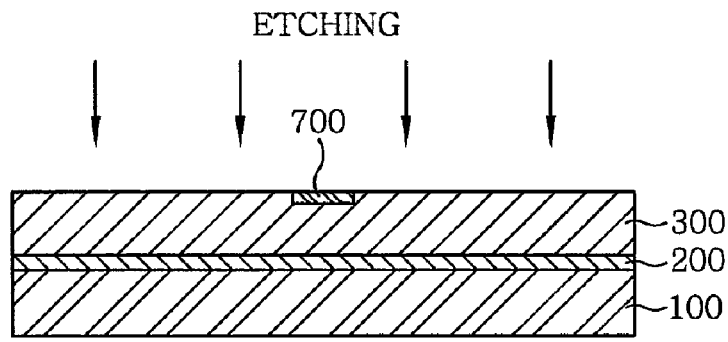

Referring next to FIG. 2i, the second sacrificial layer 600 and first sacrificial layer 400 are removed. Again, while any one of a number of techniques might be used, in an illustrated embodiment a wet or dry etching process is used. If wet etching is used, a phosphoric acid ($H_3PO_4$) solution (or the like) can be used.

Figure 2J:
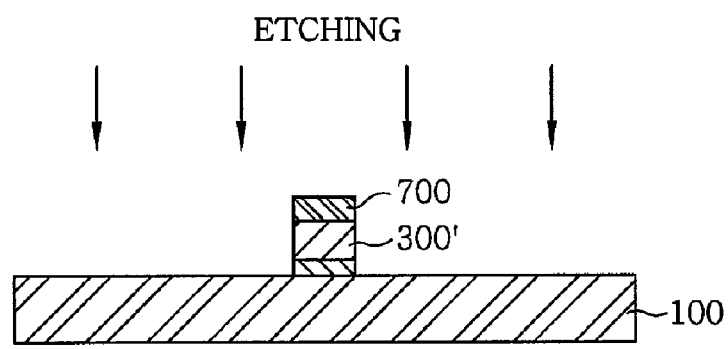

As shown in FIG. 2j, the polysilicon film 300 and gate oxide film 200 except for the region of the ion implantation layer 700 are removed. In the illustrated embodiment, this removal is performed with a main etching process by using the ion implantation layer 700 as a hard mask. This results in a gate electrode 300' being formed by the remaining polysilicon film 300.

The main etching process may be a dry etching having an anisotropic characteristic, such as RIE (Reactive Ion Etching).

Figure 2K:
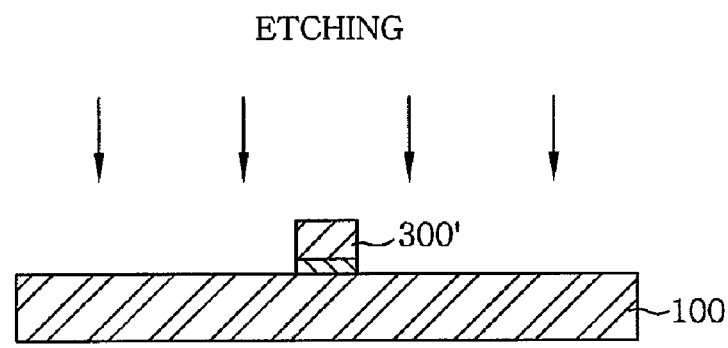

As is shown in FIG. 2k, another etching is performed in order to remove the ion implantation layer 700 used as a hard mask from the top of the gate electrode 300'. Here, a wet etching having an excellent removal selection ratio of the ion implantation layer 700, which can be an oxide film for the polysilicon film of the gate electrode 300', can be used as an etching solution in the corresponding wet etching step.

As such, the process for forming a fine gate electrode 300' is finished.

In another alternative embodiment, an atom donating layer (not shown) can be interposed between the polysilicon film 300 and the first sacrificial layer 400 on top of the polysilicon film 300. In this way, the corresponding atom donating layer can easily provide corresponding atoms to be ion-implanted in ion implantation, thereby increasing the effect of ion implantation and assisting in the formation of the ion implantation layer 700.

In such an embodiment, the atom donating layer can be formed of a material capable of providing atoms to be ion-implanted. For example, in the ion implantation of oxygen, the corresponding atom donating layer may be an oxide film, and in the ion implantation of nitrogen, the corresponding atom donating layer may be a nitride film.

In addition, if the atom donating layer is an oxide film, the corresponding oxide film may be formed artificially by deposition or the like, or may be formed of a natural oxide film by simply exposing it to the air.

As above, in case of using the atom donating layer, both the atom donating layer and the polysilicon film 300 can be removed in the step of FIG. 2j.

In summary, disclosed embodiments provide a methodology for the formation of a gate electrode having a fine line width necessary for the manufacture of a high integrated semiconductor device. As a result, at least one advantage is increased performance and quality of the resulting semiconductor device.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for forming a gate electrode of a semiconductor device, comprising:
    forming a gate oxide film, a gate electrode film, and a first sacrificial layer on the surface of a semiconductor substrate;
    forming an opening within the first sacrificial layer;
    reducing the effective width of the opening;
    forming an ion implantation layer on the top surface of the gate electrode film in a region exposed through the opening having the reduced width;
    removing the first sacrificial layer;

forming a gate electrode under the ion implantation layer; and removing the ion implantation layer.

2. The method of claim 1, further comprising performing an annealing thermal treatment for lattice recovery in the ion implantation layer.

3. The method of claim 1, wherein the effective width of the opening is reduced by depositing a spacer on a sidewall within the opening.

4. The method of claim 3, wherein the spacer is formed within the opening by depositing a second sacrificial layer on the first sacrificial layer.

5. The method of claim 4, wherein the first sacrificial layer and the second sacrificial layer are formed of the same material.

6. The method of claim 4, wherein the first sacrificial layer and the second sacrificial layer are comprised of nitride films.

7. The method of claim 4, wherein the region of the gate electrode film is exposed through the opening by performing an etching process so as to remove the second sacrificial layer formed substantially at the bottom of the opening.

8. The method of claim 1, wherein the ion implantation is performed by ion-implanting either oxygen ($O_2$) or nitrogen (N) atoms.

9. The method of claim 1, wherein an atom donating layer is formed between the gate electrode film and the first sacrificial layer to provide atoms to be ion-implanted in ion implantation.

10. The method of claim 9, wherein the atom donating layer is either an oxide film or a nitride film.

11. The method of claim 1, wherein the opening is formed by an etching process using a photoresist pattern.

12. The method of claim 11, further comprising the step of providing an anti reflective coating under the photoresist pattern.

13. The method of claim 1, wherein the gate electrode is formed under the ion implantation layer by performing an etching process using the ion implantation layer as a mask.

14. The method of claim 1, wherein the gate electrode film comprises polysilicon.

15. A method for forming a gate electrode of a semiconductor device, comprising:

forming a gate oxide film, a polysilicon film, and a first sacrificial layer on the surface of a semiconductor substrate;

forming a substantially vertical opening within the first sacrificial layer;

forming a spacer on a sidewall defined by the opening;

forming an ion implantation layer on the top surface of the polysilicon film in a region exposed through the opening, the exposed region having been narrowed by the spacer;

removing the first sacrificial layer;

forming a gate electrode under the ion implantation layer by using the ion implantation layer as a mask; and removing the ion implantation layer.

* * * * *